(12) United States Patent
Masleid et al.

(10) Patent No.: US 7,847,408 B2
(45) Date of Patent: Dec. 7, 2010

(54) INTEGRATED CLOCK AND POWER DISTRIBUTION

(75) Inventors: Robert P. Masleid, Monte Sereno, CA (US); Duncan Collier, Stockton, CA (US)

(73) Assignee: Oracle America, Inc., Redwood City, CA (US)

( * ) Notice: Subject to any disclaimer, the term of this patent is extended or adjusted under 35 U.S.C. 154(b) by 35 days.

(21) Appl. No.: 12/355,653

(22) Filed: Jan. 16, 2009

(65) Prior Publication Data
US 2010/0181685 A1  Jul. 22, 2010

(51) Int. Cl.
*H01L 23/48* (2006.01)
*H01L 23/52* (2006.01)
*H01L 29/40* (2006.01)

(52) U.S. Cl. ............... 257/773; 257/691; 257/E23.151

(58) Field of Classification Search ............ 257/691, 257/773, E23.151; 716/13; 327/295
See application file for complete search history.

(56) References Cited

U.S. PATENT DOCUMENTS

| | | | |
|---|---|---|---|
| 6,445,065 B1 * | 9/2002 | Gheewala et al. | 257/691 |
| 6,823,499 B1 | 11/2004 | Vasishta et al. | |
| 7,689,963 B1 * | 3/2010 | Masleid et al. | 716/13 |
| 2005/0245067 A1 | 11/2005 | Lin | |
| 2007/0025493 A1 * | 2/2007 | Pitkethly | 375/377 |
| 2007/0136707 A1 * | 6/2007 | Teig et al. | 716/6 |
| 2007/0157144 A1 | 7/2007 | Mai et al. | |

FOREIGN PATENT DOCUMENTS

WO  2007005691 A1  1/2007

OTHER PUBLICATIONS

International Search Report and the Written Opinion for PCT/US2009/044641 mailed Jan. 29, 2010 (16 pages).

* cited by examiner

*Primary Examiner*—Jarrett J Stark
(74) *Attorney, Agent, or Firm*—Osha • Liang LLP

(57) ABSTRACT

An integrated clock and power distribution network in a semiconductor device includes assigning a first tile to a location on a placement grid corresponding to a top metal layer. An orientation is assigned to the first tile relative to the top metal layer placement grid. The first tile is placed on a representation corresponding to the top metal layer in accordance with the assignments. A second tile is assigned to a location on a placement grid corresponding to a top-1 metal layer. The orientation is assigned to the second tile relative to the top-1 metal layer placement grid. The second tile is placed on a representation corresponding to the top-1 metal layer in accordance with the assignments. The first and second tile are arranged as a full-dense-mesh distribution structure. The first tile includes an integrated clock and power distribution structure. The second tile includes a low impedance underpass structure.

9 Claims, 11 Drawing Sheets

US 7,847,408 B2

INTEGRATED CLOCK AND POWER DISTRIBUTION

BACKGROUND OF INVENTION

The quality of the distribution of power within a semiconductor device impacts the performance of the semiconductor device in terms of frequency and power. The frequency of the semiconductor device is determined by the worst-case transient droop seen by a circuit when it switches. The active power dissipation is determined by the square of the voltage that the circuit recovers to after the switching has stopped. Taken together, these performance penalties reduce the anticipated gains made by advancing to a next generation semiconductor process by roughly half.

The quality of the distribution of clock signals within the semiconductor device also impacts the performance of the semiconductor device in terms of frequency. Modern semiconductor devices have poor matching between individual devices or wires, yet it is desirable to minimize the skew among the numerous branches of a clock distribution network. Minimizing the delay through the clock distribution network reduces error. Wire propagation delay accounts for roughly half of the total clock distribution delay.

SUMMARY OF INVENTION

According to one aspect of one or more embodiments of the present invention, a method of producing an integrated clock and power distribution network in a semiconductor device includes: defining an orthogonal placement grid comprising a plurality of locations wherein each location is identified by an integer x-coordinate and an integer y-coordinate; identifying even locations within the grid wherein a location is even if an integer representing a sum of the location's x-coordinate and y-coordinate is mathematically even; assigning a tile to each even location; assigning an orientation to each tile; and placing the tiles in a representation corresponding to a metal layer of the semiconductor device in accordance with the assignments. The tiles include integrated clock and power tiles in a full-dense-mesh configuration.

According to one aspect of one or more embodiments of the present invention, a method of producing an integrated clock and power distribution network in a semiconductor device includes: assigning a first tile to a location on a placement grid corresponding to a top metal layer; assigning an orientation to the first tile relative to the top metal layer placement grid; placing the first tile on a representation corresponding to the top metal layer in accordance with the assignments; assigning a second tile to a location on a placement grid corresponding to a top-1 metal layer; assigning the orientation to the second tile relative to the top-1 metal layer placement grid; and placing the second tile on a representation corresponding to the top-1 metal layer in accordance with the assignments. The first tile and the second tile are arranged as a full-dense-mesh distribution structure. The first tile includes an integrated clock and power distribution structure. The second tile includes a low impedance underpass structure corresponding to the integrated clock and power distribution structure.

According to one aspect of one or more embodiments of the present invention, a semiconductor device includes a semiconductor layer and a plurality of metal layers. A top metal layer and a top-1 metal layer are arranged as a full-dense-mesh distribution network. The top metal layer includes an integrated clock and power distribution network. The top-1 metal layer includes a low impedance underpass corresponding to the integrated clock and power distribution network.

According to one aspect of one or more embodiments of the present invention, a system includes a semiconductor device, a storage device, a network device, and an input device. The semiconductor device includes a semiconductor layer, and a plurality of metal layers. A top metal layer and a top-1 metal layer are arranged as a full-dense-mesh distribution network. The top metal layer includes an integrated clock and power distribution network. The top-1 metal layer includes a low impedance underpass corresponding to the integrated clock and power distribution network.

Other aspects of the present invention will be apparent from the following description and the appended claims.

DETAILED DESCRIPTION

Figure 1:
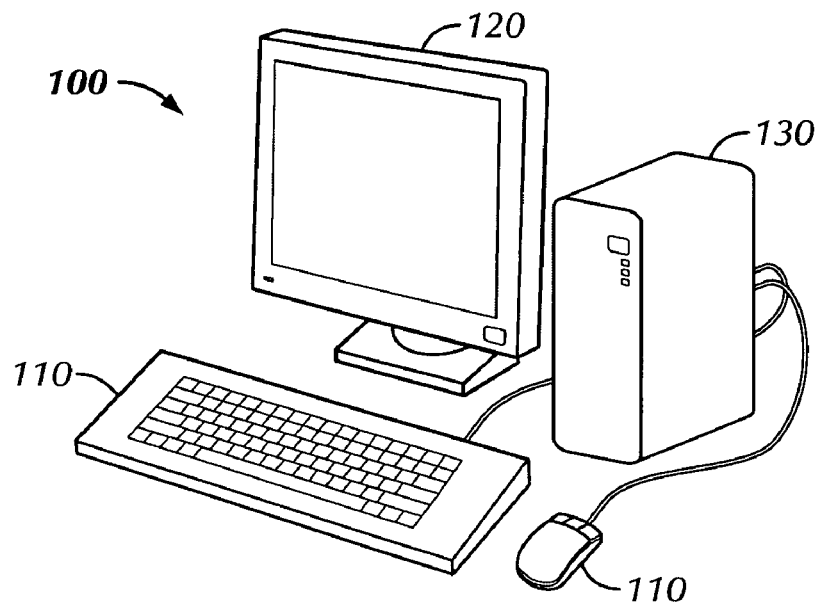
FIG. 1 shows a system in accordance with one or more embodiments of the present invention.

Specific embodiments of the present invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. In other instances, well-known features have not been described in detail to avoid obscuring the description of embodiments of the present invention.

FIG. 1 shows a system in accordance with one or more embodiments of the present invention. A system 100 includes an input device 110, an output device 120, and a mechanical chassis 130. The mechanical chassis 130 includes a printed circuit board, a network device, and a storage device (not shown).

Figure 2:
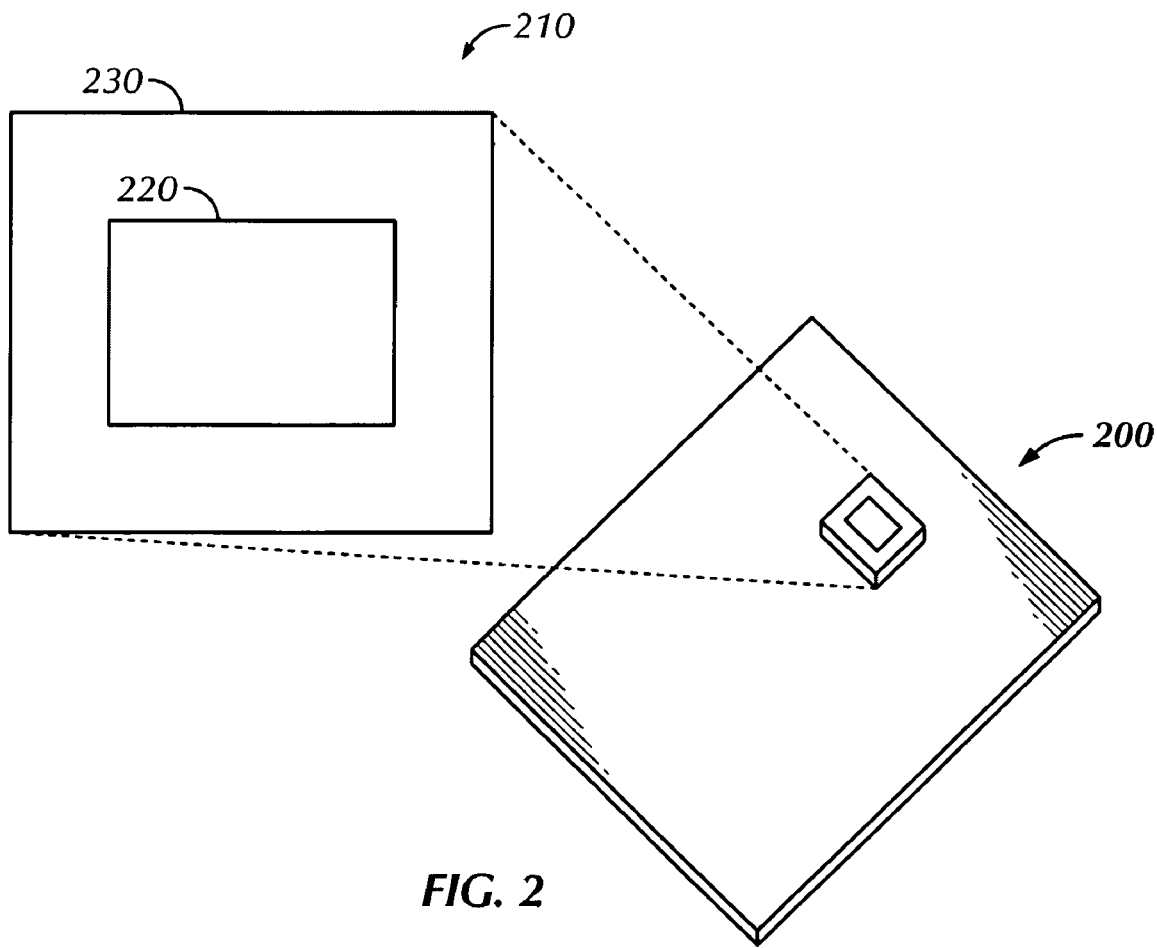
FIG. 2 shows a printed circuit board that includes one or more semiconductor device(s) that each includes one or more semiconductor die in accordance with one or more embodiments of the present invention.

FIG. 2 shows a printed circuit board in accordance with one or more embodiments of the present invention. A printed circuit board ("PCB") 200 includes one or more semiconductor device(s) 210. Each semiconductor device 210 includes one or more semiconductor die 220 encapsulated in a mechanical package 230. The mechanical package 230 serves as an electrical and mechanical interface between the die 220 and the PCB 200.

The PCB 200 provides one or more external clock signals to the semiconductor device 220. The mechanical package 230 provides the external clock signal(s) to the die 220. The die 220 generates one or more internal clock signals that are a function of the provided external clock signal(s). The internal clock signals are typically the most heavily loaded, the most widely distributed, and the fastest signals within the die 220. As such, clock distribution networks are used to provide the clock signals to the proper loads within the die.

FIG. 3 shows a bow tie element in accordance with one or more embodiments of the present invention. With reference to FIG. 3(a), bow tie element 310 is comprised of two half-bow tie elements 301 and additional wire 300 structured at planar angles $\theta_1$ and $\theta_2$ as depicted in the figure. Each half-bow tie element 301 is comprised of two wires 300 structured such that the planar angle between the constituent wires 300 of the half-bow tie 301 is $\theta_1$. In one embodiment of the present invention, $\theta_1$ is 90 degrees and $\theta_2$ is 135 degrees. One of ordinary skill in the art will recognize that $\theta_1$, $\theta_2$, and the relative lengths of the various segments of wire 300 could be vary, separately or in combination, in accordance with one or more embodiments of the present invention. Additionally, one of ordinary skill in the art will recognize that bow tie element 310 or any constituent portion thereof could be rotated in accordance with one or more embodiments of the present invention.

Figure 3A:
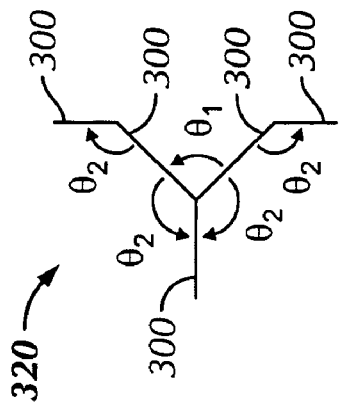
FIG. 3 shows bow tie elements, half-bow tie elements, extended half-bow tie elements, and three-half-bow tie elements in accordance with one or more embodiments of the present invention.
Figure 3B:
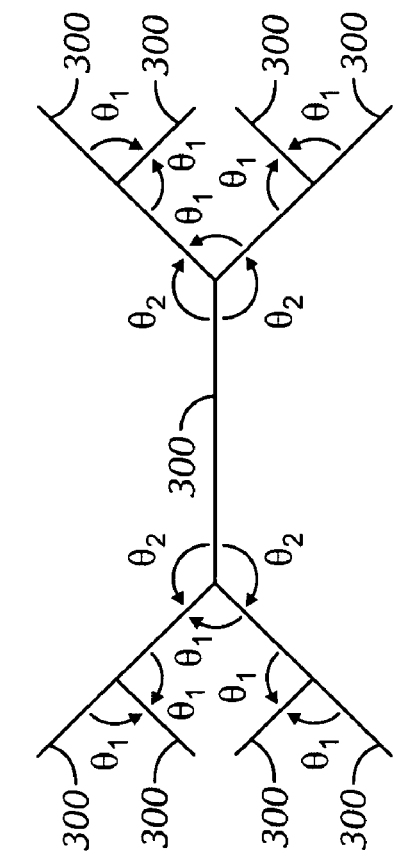

With reference to FIG. 3(b), an extended half-bow tie element 320 is comprised of a half-bow tie element 301 and three additional wires 300 structured at planar angles $\theta_1$ and $\theta_2$ as depicted in the figure. In one embodiment of the present invention, $\theta_1$ is 90 degrees and $\theta_2$ is 135 degrees. One of ordinary skill in the art will recognize that $\theta_1$, $\theta_2$, and the relative lengths of the various segments of wire 300 could vary, separately or in combination, in accordance with one or more embodiments of the present invention. Additionally, one of ordinary skill in the art will recognize that extended half-bow tie element 320 could be rotated in accordance with one or more embodiments of the present invention.

Figure 3C:
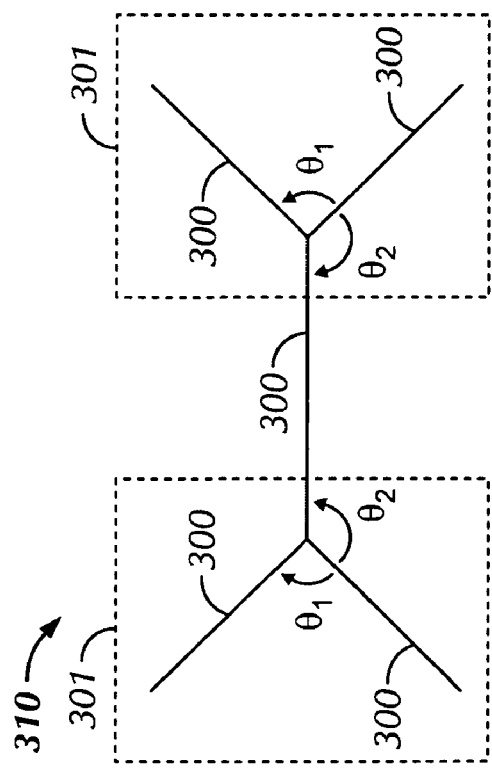

With reference to FIG. 3(c), a three-half-bow tie element 330 is comprised of three half-bow tie elements 301. Each half-bow tie element 301 is comprised of two wires 300 structured such that the planar angle between the constituent wires 300 of the half-bow tie 301 is $\theta_1$. The three-half-bow tie element 330 is comprised of three separate half-bow tie elements 301 structured at planar angle $\theta_1$ as depicted in the figure. In one embodiment of the present invention, $\theta_1$ is 90 degrees. One of ordinary skill in the art will recognize that $\theta_1$ and the relative lengths of the various segments of wire 300 could vary, separately or in combination, in accordance with one or more embodiments of the present invention. Additionally, one of ordinary skill in the art will recognize that three-half-bow tie element 330 could be rotated in accordance with one or more embodiments of the present invention.

Figure 3D:
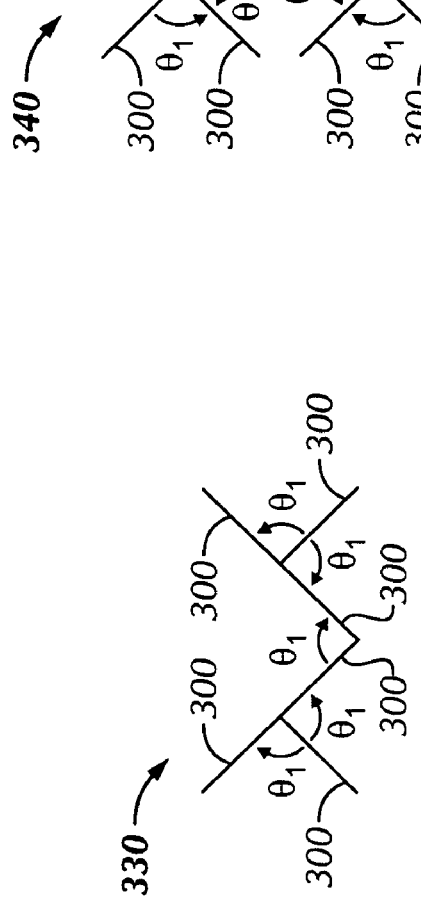

With reference to FIG. 3(d), a hyper-fine bow tie element 340 is comprised of two half-bow tie elements 301 and five additional wires 300 structured at angles $\theta_1$ and $\theta_2$ as depicted in the figure. In one embodiment of the present invention, $\theta_1$ is 90 degrees and $\theta_2$ is 135 degrees. One of ordinary skill in the art will recognize that $\theta_1$, $\theta_2$, and the relative lengths of the various segments of wire 300 could vary in accordance with one or more embodiments of the present invention. Additionally, one of ordinary skill in the art will recognize that hyper-fine bow tie element 340 could be rotated in accordance with one or more embodiments of the present invention.

In view of the above, one of ordinary skill in the art will recognize that there are a variety of ways in which to construct a bow tie element in accordance with one or more embodiments of the present invention.

Figure 4:
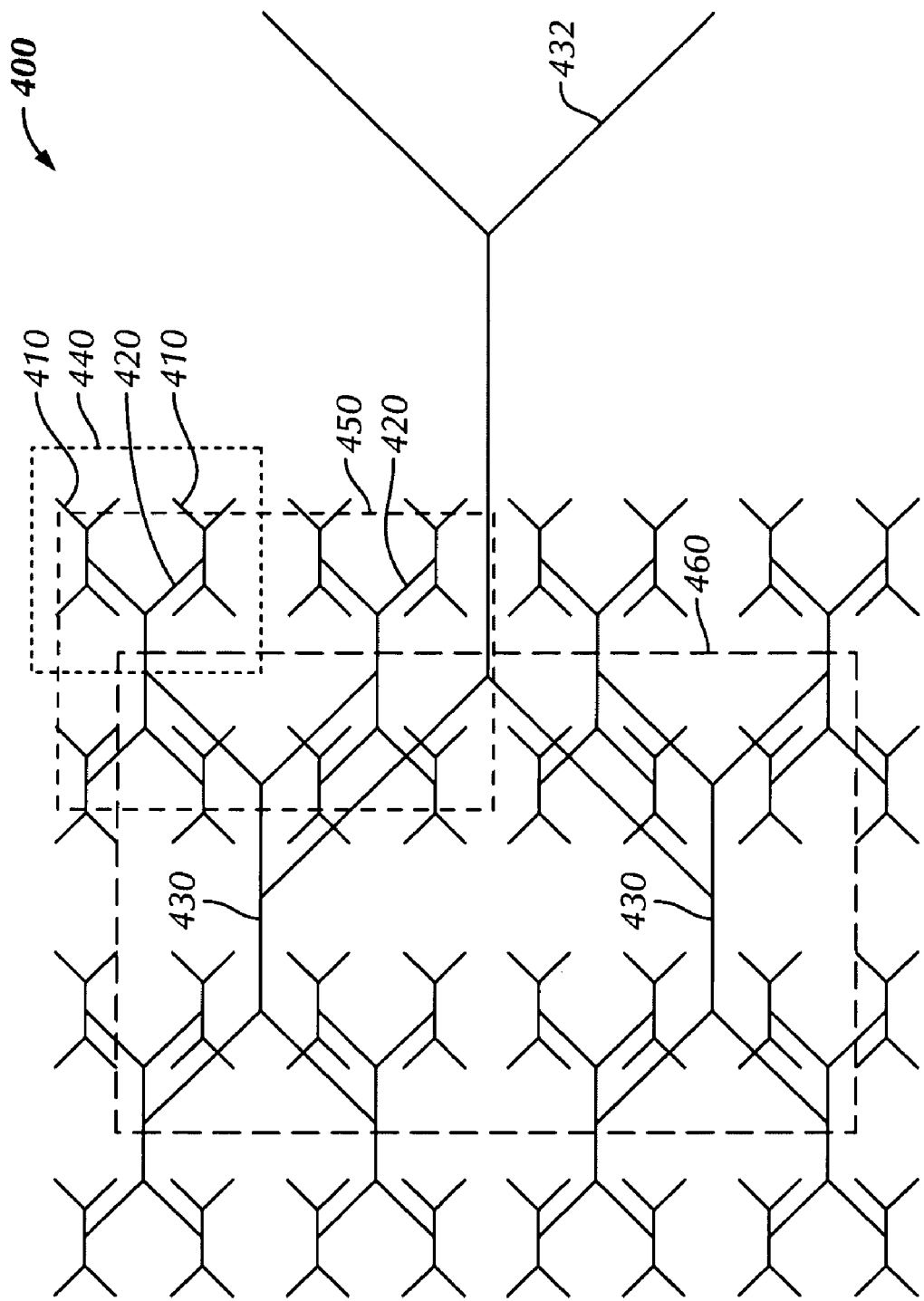
FIG. 4 shows a clock distribution network comprised of an ideal fractal clock tree of bow tie elements in accordance with one or more embodiments of the present invention.

FIG. 4 shows a clock distribution network comprised of an ideal fractal clock tree of bow tie elements in accordance with one or more embodiments of the present invention. One of ordinary skill in the art will recognize that fractals are hierarchical patterns comprised of unit tiles. The unit tiles are comprised of one or more elements. The elements at each level of the hierarchy are similar, but scaled based on the position of the elements within the hierarchy (self-similarity).

In one or more embodiments of the present invention, the clock distribution network is comprised of fractal clock tree 400. Fractal clock tree 400 is comprised of a plurality of bow tie elements 410, 420, 430, and 432 that are each utilized at their respective hierarchical level of the fractal clock tree 400. At the lowest hierarchical level, unit tile 440 is comprised of two bow tie elements 410. At the next hierarchical level, unit tile 450 is comprised of two bow tie elements 420. At the highest hierarchical level, unit tile 460 is comprised of two bow tie elements 430. One of ordinary skill in the art will recognize that additional bow tie elements of a different scale and additional hierarchical levels could be utilized in accordance with one or more embodiments of the present invention.

The clock distribution network minimizes the maximum distance from source to destination because each bow tie element 410, 420, 430, and 432 utilizes diagonal routes. In one embodiment of the present invention, bow tie elements 410, 420, 430, and 432 provide for diagonal routes that are approximately 30% shorter than the typical Manhattan-routed H-tree distribution. In addition, because of the reduced distance, approximately 30% fewer repeaters are required for the clock distribution network.

Moreover, modern semiconductor processes recommend or require uniform poly-silicon orientation. This, in turn, produces uniform circuit stack orientation and uniform clock spine orientation. Clock spines are required to be spatially frequent and low skew. As a result, the clock distribution destination grid need not have equal x-axis and y-axis pitch.

In one embodiment of the present invention, the use of bow tie elements allows for non-uniform x-axis and y-axis pitches. The use of bow tie elements in a clock tree provides fine pitch to match the clock spine pitch in the y-axis direction and allows for coarse pitch in the x-axis direction, which is desirable because the clock spines themselves must provide a low skew distribution of the clock in the x-axis direction. The bow tie element structure exploits the coarse pitch in the x-axis direction to reduce the total routing length of the clock distribution network and the number of clock self-crossings.

In one or more embodiments of the present invention, the clock distribution network of FIG. 4 provides for minimal delay through the clock tree and minimal power for the clock tree as measured by the total amount of power and number of repeaters used. In one embodiment of the present invention, as depicted in FIG. 4, the clock distribution network has numerous self-crossings.

In one or more embodiments of the present invention, a full-dense-mesh ("FDM") distribution structure is comprised of a tile formed on a top metal layer and a corresponding tile formed on the next layer down ("top-1 metal layer") from the top of the semiconductor stack. The top metal layers are the most effective at distributing on-die currents per wiring-track-assigned-to-power. The top layers are thick and have relatively low sheet resistance. Additionally, in comparison to other layers, top metal layers cost less and have good yield due to coarse layout rules. One of ordinary skill in the art will recognize that other metal layers could be utilized in accordance with one or more embodiments of the present invention.

In one or more embodiments of the present invention, the FDM distribution structure utilizes an integrated clock and power distribution structure formed on the top metal layer of the semiconductor stack and a corresponding low impedance underpass structure on the top-1 metal layer. The FDM distribution structure may include any combination of clock, power, vias, bump pads, or signal elements. The top metal layer is separated from the top-1 metal layer by approximately 2μ (microns), producing a low inductance of approximately 1 μH per square. One of ordinary skill in the art will recognize that the separation could vary in accordance with one or more embodiments of the present invention. The FDM structure carries current on two perpendicular axes. Power bump pads are incorporated as distribution conductors. In addition, redistribution current is handled by the FDM structure. This allows other metal layers, not part of the FDM structure, to shrink their power buses and, thereby, increase their routing capacity.

Figure 5:
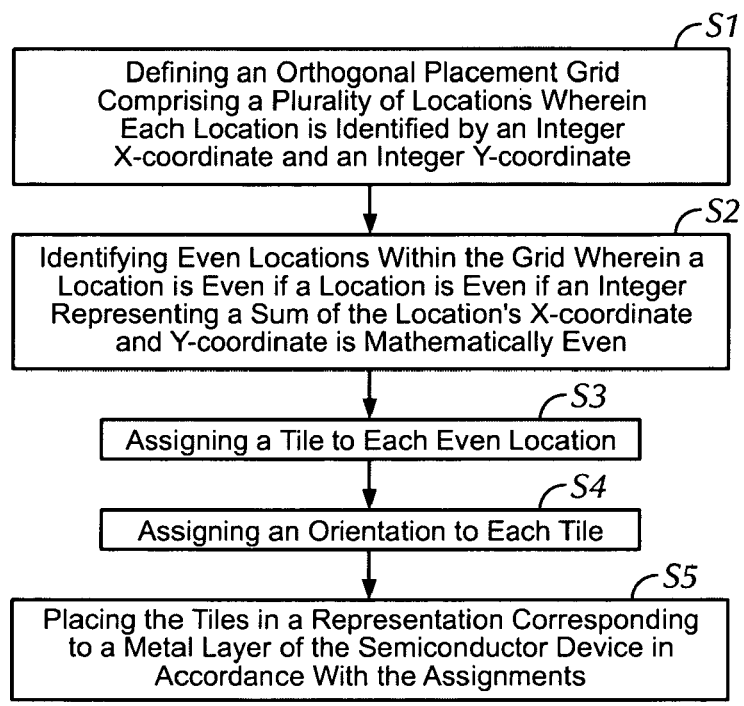
FIG. 5 shows a method of producing an integrated clock and power distribution network in a semiconductor device in accordance with one or more embodiments of the present invention.

FIG. 5 shows a method of producing an integrated clock and power distribution network in a semiconductor device in accordance with one or more embodiments of the present invention. In S1, an orthogonal placement grid is defined comprising a plurality of locations. Each location is identified by an integer x-coordinate and an integer y-coordinate. In S2, even locations within the grid are identified. A location is even if an integer representing a sum of the location's x-coordinate and y-coordinate is mathematically even. In S3, a tile is assigned to each even location. In S4, each assigned tile is assigned an orientation relative to a selected origin. In S5, the tiles are placed in a representation corresponding to a metal layer of the semiconductor device in accordance with the assignments. The tiles include tiles that represent a portion of an integrated clock and power distribution.

Figure 6:
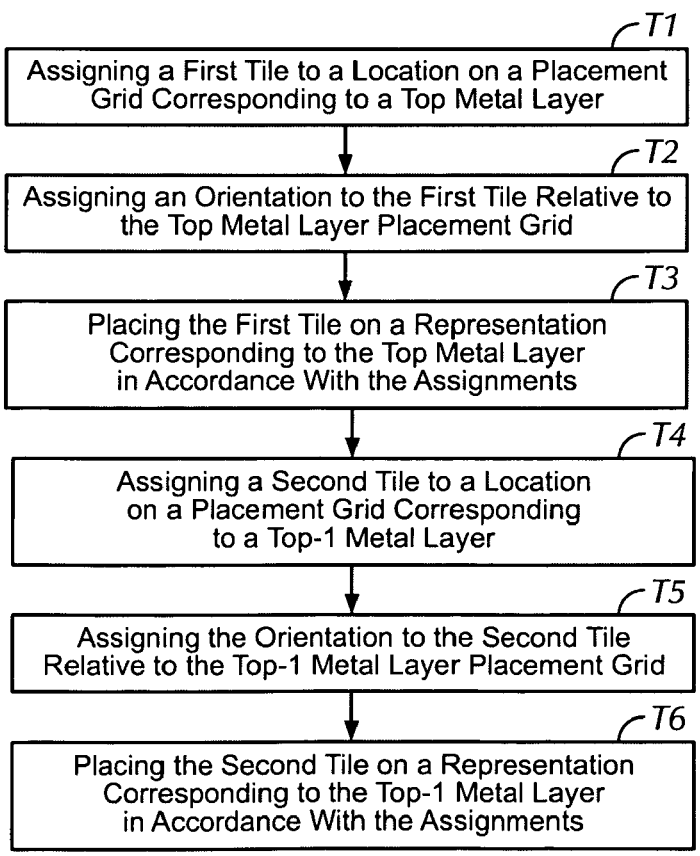
FIG. 6 shows a method of producing an integrated clock and power distribution network in a semiconductor device in accordance with one or more embodiments of the present invention.

FIG. 6 shows a method of producing an integrated clock and power distribution network in a semiconductor device in accordance with one or more embodiments of the present invention. In T1, a first tile is assigned to a location on a placement grid corresponding to a top metal layer. In T2, an orientation is assigned to the first tile relative to the top metal layer placement grid. In T3, the first tile is placed on a representation corresponding to the top metal layer in accordance with the assignments. In T4, a second tile is assigned to a location on a placement grid corresponding to a top-1 metal layer. In T5, the orientation of the first tile is assigned to the second tile relative to the top-1 metal layer placement grid. In T6, the second tile is placed on a representation corresponding to the top-1 metal layer in accordance with the assignments. The first tile and the second tile are arranged as a FDM distribution structure. The first tile is an integrated clock and power distribution structure. The second tile is a low impedance underpass structure corresponding to the integrated clock and power distribution structure.

Figure 7:
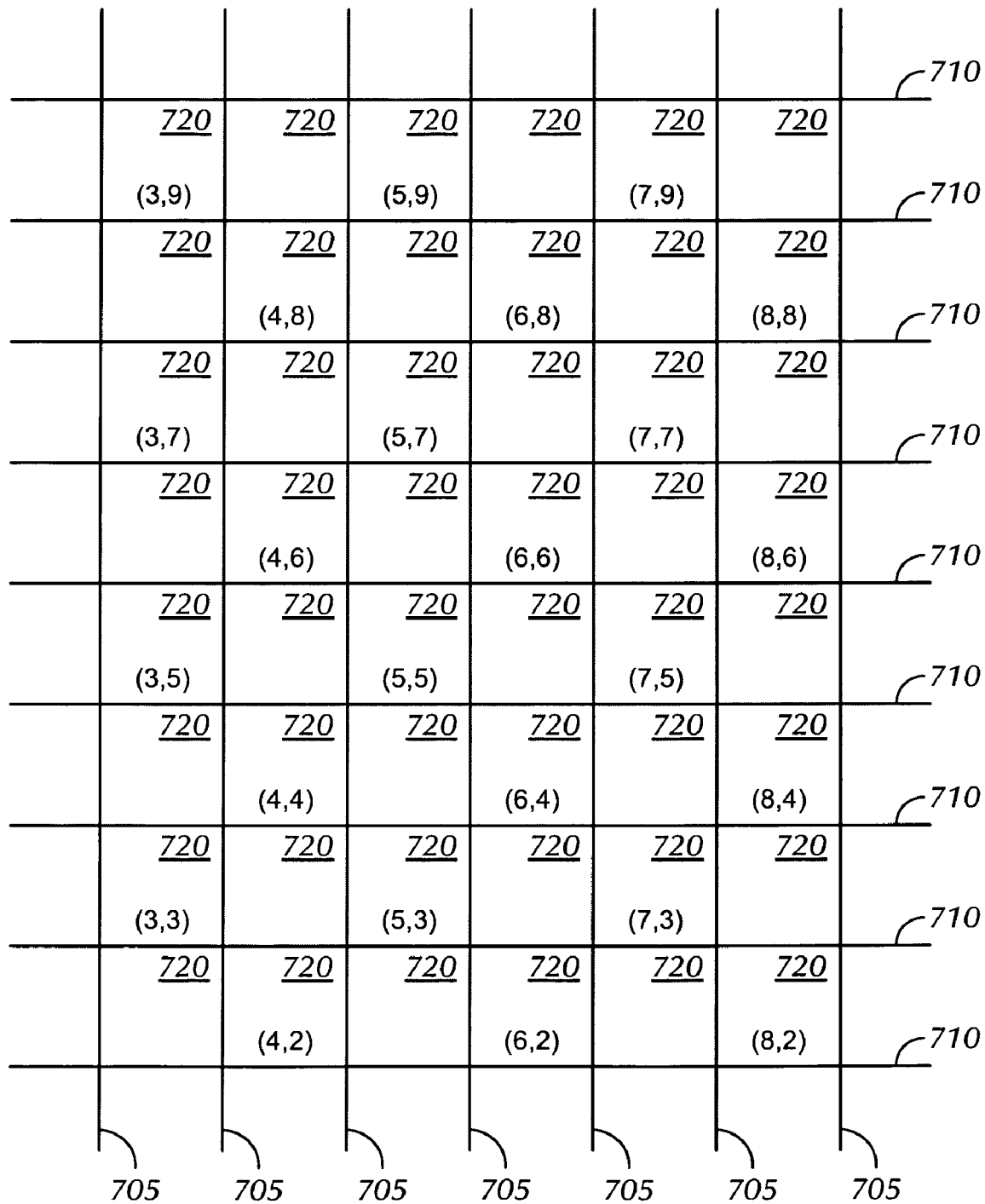
FIG. 7 shows a portion of an orthogonal placement grid in accordance with one or more embodiments of the present invention.

FIG. 7 shows a portion of an orthogonal placement grid in accordance with one or more embodiments of the present invention. The orthogonal placement grid is defined by a number of vertical lines 705 that are orthogonal to a number of horizontal lines 710 in an x-y plane. A plurality of locations 720 are identified by an integer x-axis coordinate and an integer y-axis coordinate relative to a selected origin. One of ordinary skill in the art will recognize that the coordinate representation could vary in accordance with one or more embodiments of the present invention.

Figure 8:
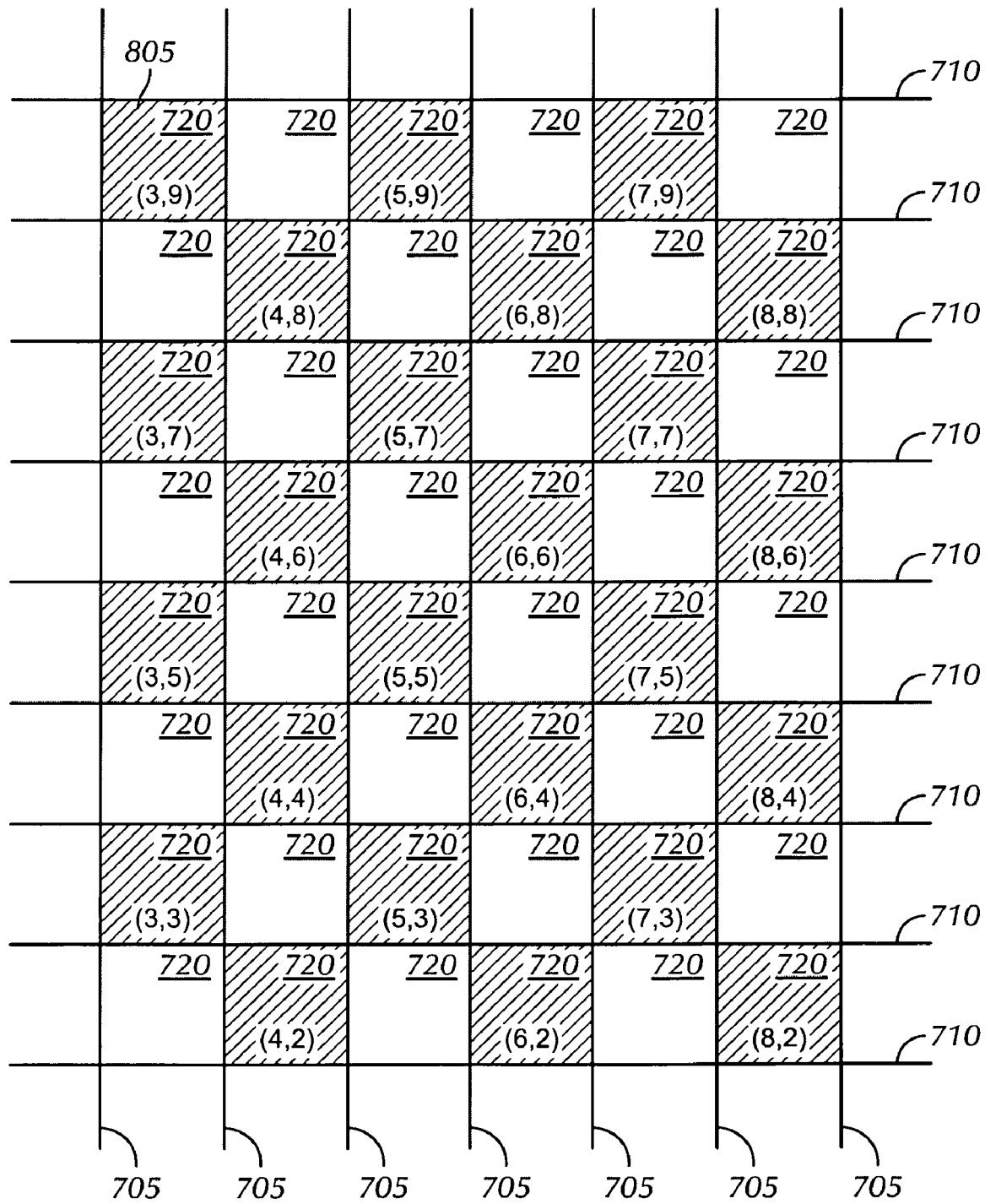
FIG. 8 shows a portion of an orthogonal placement grid and even locations within the grid in accordance with one or more embodiments of the present invention.

FIG. 8 shows a portion of an orthogonal placement grid and even locations within the grid in accordance with one or more embodiments of the present invention. Even locations within the grid are identified and highlighted. A location is even if an integer representing a sum of the location's x-coordinate and y-coordinate is mathematically even. For example, location 805 is identified by the x-y integer coordinate pair (3,9) relative to a selected origin. The sum of the x-coordinate and y-coordinate is 12, which is mathematically even. Thus, location 805 is identified as an even location and is highlighted in the figure for illustrative purposes only. Each location within the grid is evaluated in a similar manner and all even locations are identified. One of ordinary skill in the art will recognize that the identification could vary based on the coordinate representation utilized in accordance with one or more embodiments of the present invention.

Figure 9:
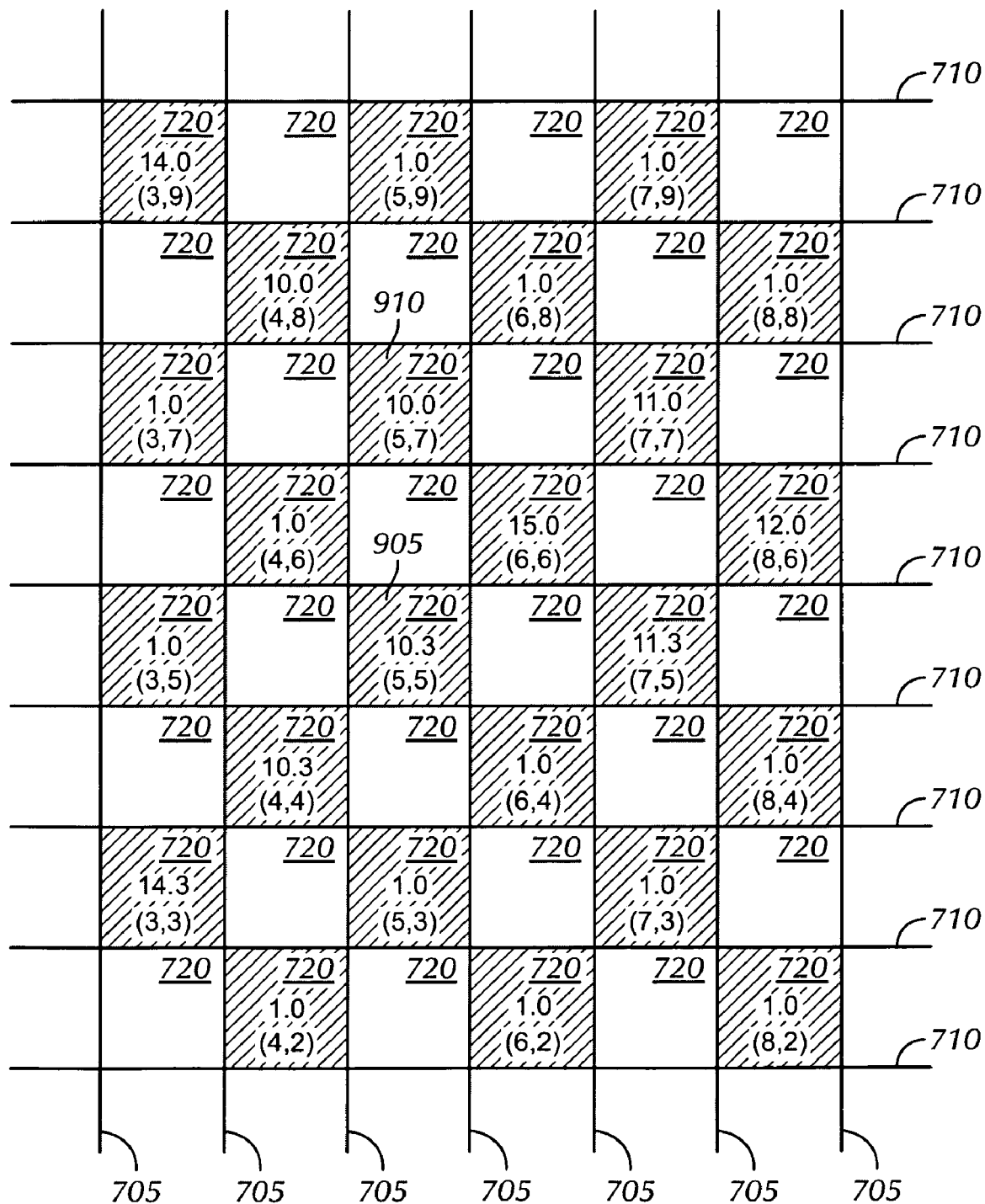
FIG. 9 shows a portion of an orthogonal placement grid with tile type and tile orientation assignments for even locations in accordance with one or more embodiments of the present invention.

FIG. 9 shows a portion of an orthogonal placement grid with tile type and tile orientation assignments for even locations in accordance with one or more embodiments of the present invention. In one or more embodiments of the present invention, a tile type is represented by an integer. For purposes of illustration only, a 0 indicates that no tile is placed, an integer in the range from 1 to 9 indicates that one of nine distinct power tiles are placed, and an integer in the range from 10 to x indicates that a distinct clock route, branch, or via tile is placed. One of ordinary skill in the art will recognize that the number, types, and assignment of integers to tile types may vary in accordance with one or more embodiments of the present invention.

In one or more embodiments of the present invention, a tile orientation is represented by an integer. For purposes of illustration only, even integers indicate no mirroring and odd integers indicate mirroring. In both cases, the magnitude of the integer represents a degree of rotation from 0 to 360 degrees. One of ordinary skill in the art will recognize that a mirrored tile is a mirrored image of the tile with respect to an axis in the x-y plane. Returning to the example, a 0 indicates no mirroring and no rotation, a 2 indicates no mirroring and 90 degree rotation, a 4 indicates no mirroring and 180 degree rotation, and a 6 indicates no mirroring and 270 degree rotation. Similarly, a 1 indicates mirroring and no rotation, a 3 indicates mirroring and 90 degree rotation, a 5 indicates mirroring and 180 degree rotation, and a 7 indicates mirroring and 270 degree rotation. Taken together, a tile type and tile orientation for a given location may be represented by an "x,y" integer pair.

For example, location 905 contains a tile type and tile orientation of 10.3, meaning an integrated clock and power tile that is mirrored and rotated 90 degrees. Similarly, location 910 contains a tile type and tile orientation of 10.0, meaning an integrated clock and power tile that is not mirrored and not rotated. One of ordinary skill in the art will recognize that the tile type and tile orientation could be represented in different ways in accordance with one or more embodiments of the present invention.

Figure 10:
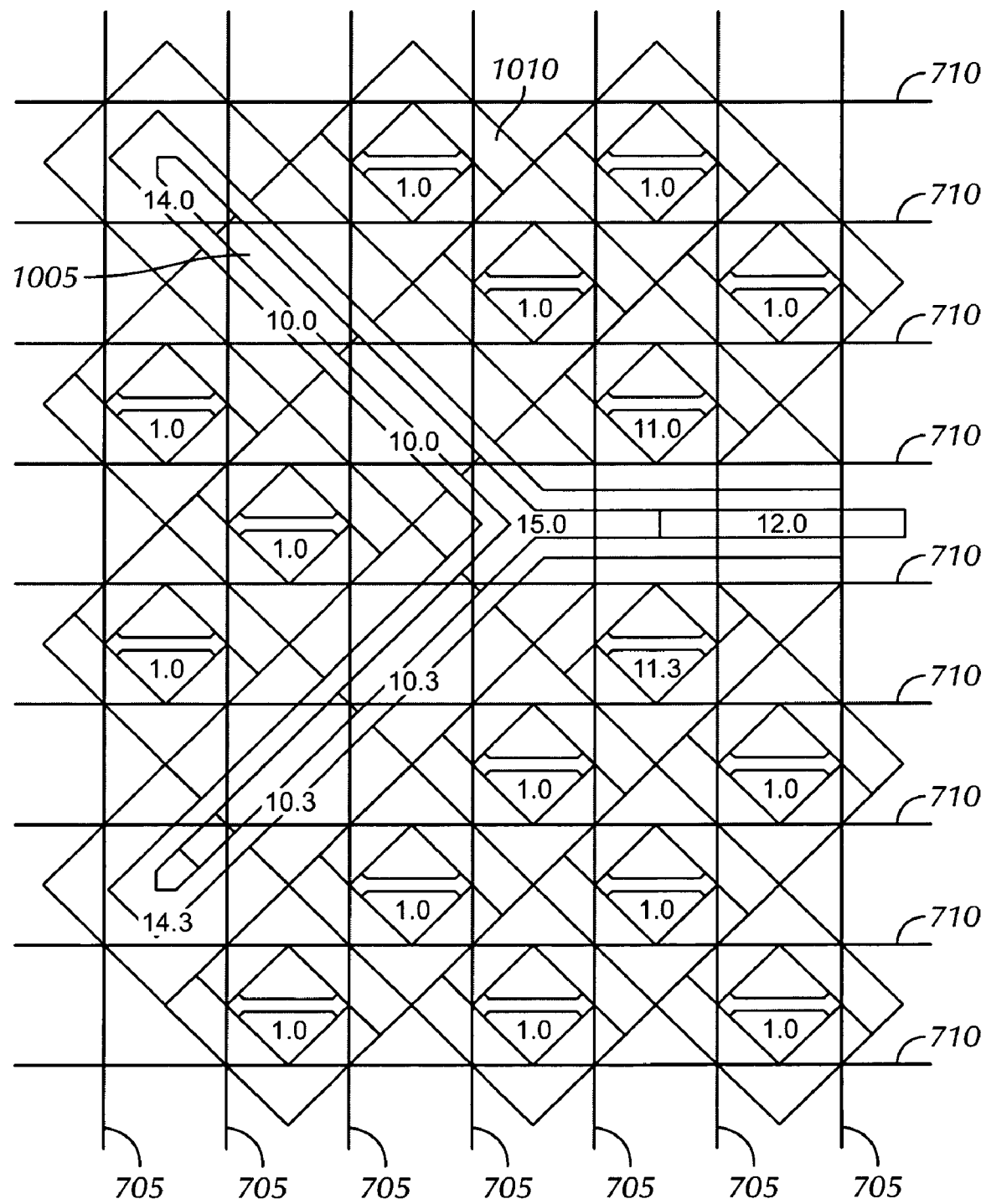
FIG. 10 shows a portion of an exemplary placement of tiles according to tile type and tile orientation for even locations in accordance with one or more embodiments of the present invention.

FIG. 10 shows a portion of an exemplary placement of tiles according to tile type and tile orientation for even locations in accordance with one or more embodiments of the present invention. Tiles are placed in accordance with their assigned location, tile type, and tile orientation. For purposes of illustration only, the placed tiles include a number of power tiles and a number of integrated clock and power distribution tiles. Because the figure depicts only a limited portion of the placement grid, the clock 1005 shown may be a portion of a bow tie element or a half-bow tie element. Voltage $V_{dd}$ 1010 represents the remainder of the metal as part of the power distribution network. One of ordinary skill in the art will recognize that placement means floor planning in a representation, which corresponds to a metal layer of a semiconductor device. Further, one of ordinary skill in the art will recognize that placement is typically performed through the use of Computer Aided Design ("CAD") software.

Figure 11:
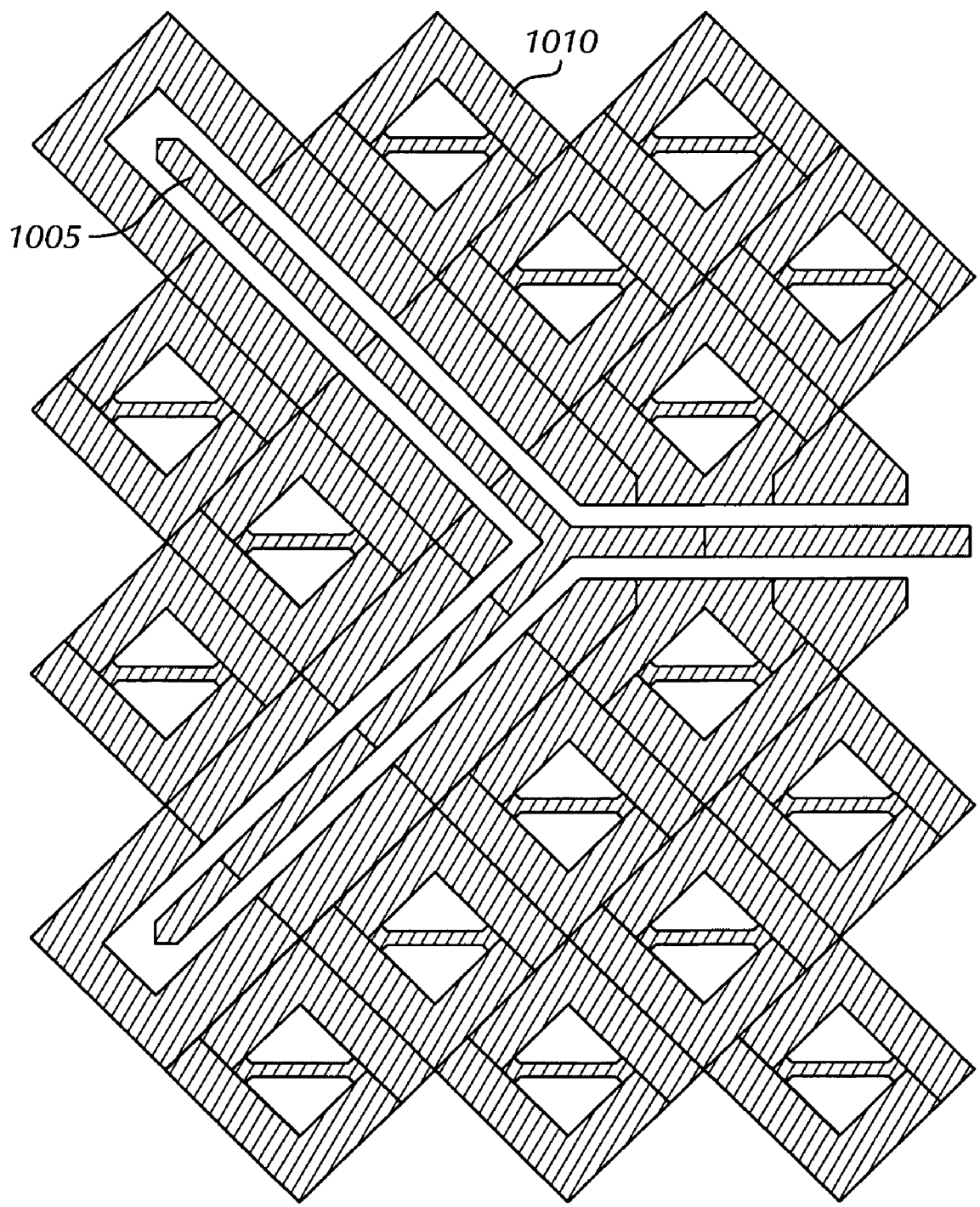
FIG. 11 shows a portion of an exemplary top metal layer full dense mesh of an integrated clock and power distribution in accordance with one or more embodiments of the present invention.

FIG. 11 shows a portion of an exemplary top metal layer FDM integrated clock and power distribution in accordance with one or more embodiments of the present invention. The highlighted portion shows a representation of metal corresponding to the portion of the placement grid. As noted above, clock 1005 may be a portion of a bow tie element or a half-bow tie element. The remaining portion of the metal represents voltage $V_{dd}$ 1010 as part of the power distribution network.

Figure 12:
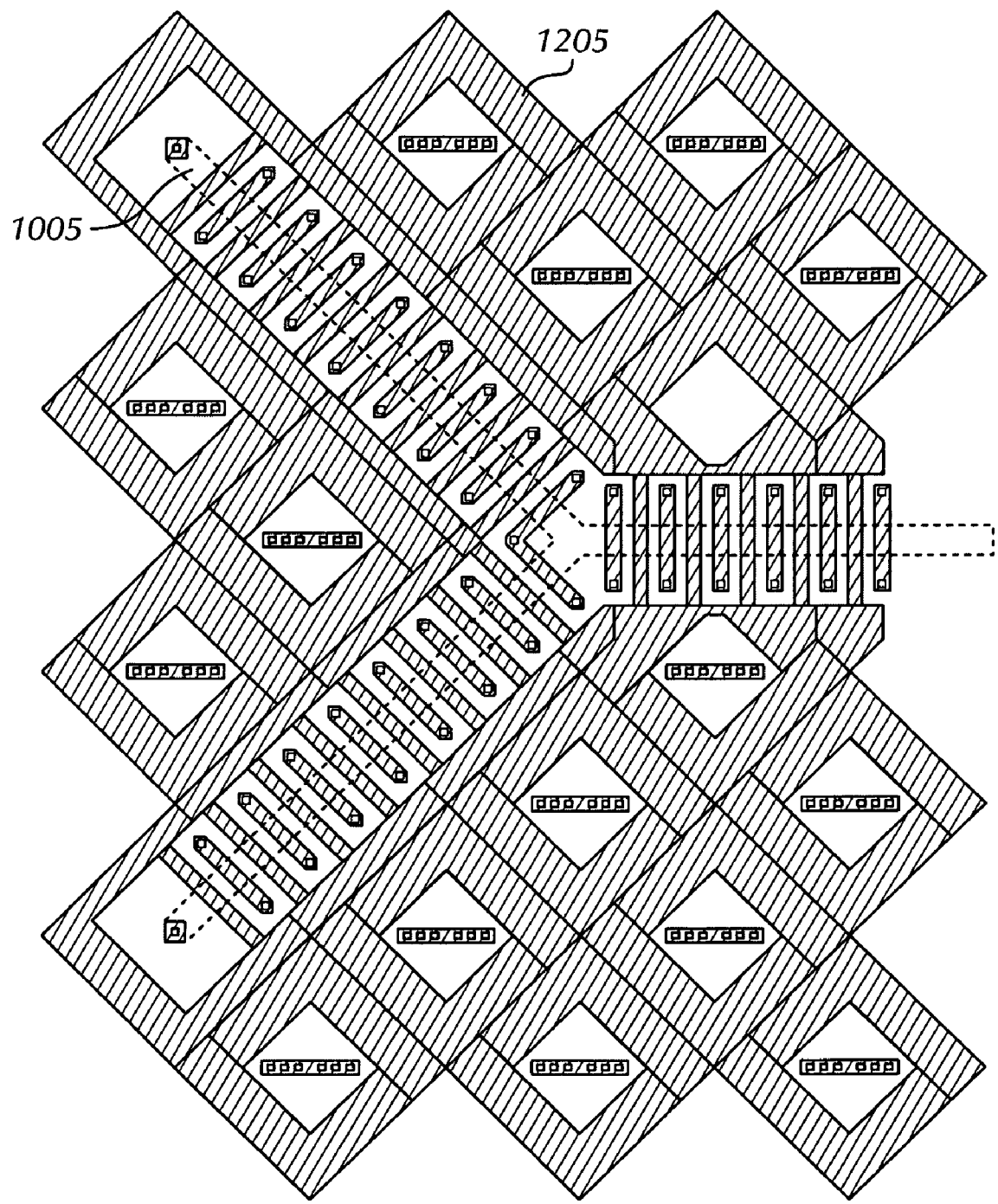
FIG. 12 shows a portion of an exemplary top-1 metal layer full dense mesh of a low impedance underpass corresponding to the integrated clock and power distribution in accordance with one or more embodiments of the present invention.

FIG. 12 shows a portion of an exemplary top-1 metal layer FDM low impedance underpass corresponding to the integrated clock and power distribution of FIG. 11 in accordance with one or more embodiments of the present invention. Because of the design of the underpasses, clock 1005, represented by a dotted line to indicate its location on the corresponding top metal layer, couples approximately 50% to voltage $V_{dd}$ 1010 (not shown) and approximately 50% to the reference voltage $V_{ss}$ 1205. This minimizes the effect of any common mode and differential mode noise on the clock repeater receiving the clock transition. Further, there is no passive coupling to any other node. The underpass gaps are too narrow to permit capacitive coupling of the digital signals lower in the stack. Through coupling is heavily suppressed due to the low impedance of the underpass wires in the FDM pair. In addition, inductive coupling from switching signals is prevented by the FDM pair. On-die signals induce a magnetic field below the FDM pair. The FDM pair forms an "image plane" (an electrical mirror) so the magnetic field above the plane is zero.

Figure 13:
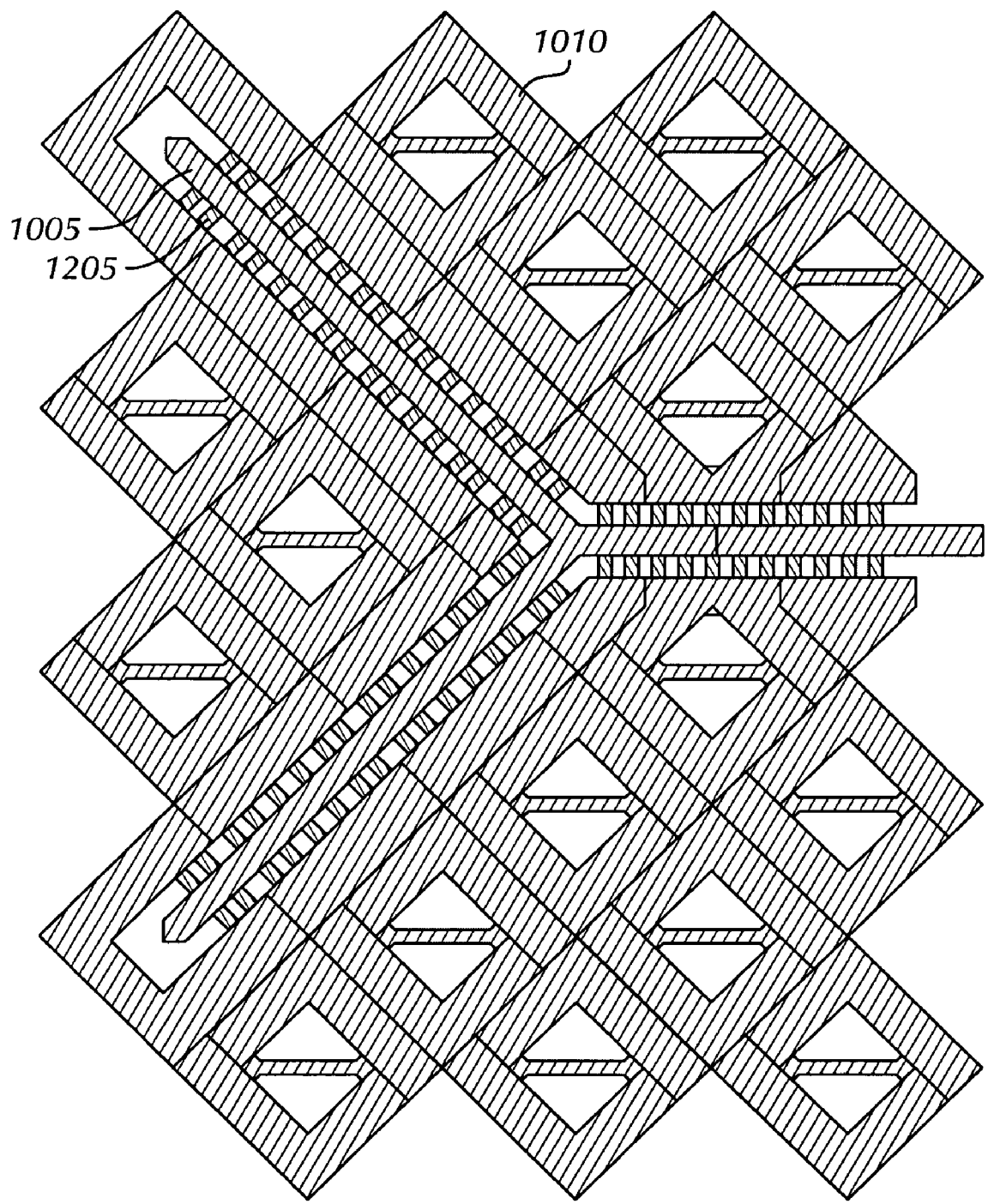
FIG. 13 shows a portion of an exemplary composite of the top metal layer and the top-1 metal layer full dense mesh corresponding to a portion of an integrated clock and power distribution network in accordance with one or more embodiments of the present invention.

FIG. 13 shows a portion of an exemplary composite of the top metal layer and the top-1 metal layer FDM corresponding to a portion of an integrated clock and power distribution network. The composite can be viewed as if looking down on the top metal layer, seeing all the features of the top metal layer and portions of the top-1 metal layer when not obscured by the top metal layer. A portion of the clock distribution network, clock 1005, is shown as routed on the top metal layer. As noted above, clock 1005 represents a portion of a bow tie element or a half-bow tie element. In addition, voltage $V_{dd}$ 1010 is shown as routed on the top metal layer. The reference voltage $V_{ss}$ 1205 on the top-1 metal layer is only partially visible in the areas in which it is not obscured by corresponding metal on the top metal layer.

Advantages of one or more embodiments of the present invention may include one or more of the following.

In one or more embodiments of the present invention, the clock distribution is integrated with the power distribution in a metal FDM structure.

In one or more embodiments of the present invention, the integrated clock and power distribution allows for decreased minimum operating voltage.

In one or more embodiments of the present invention, the integrated clock and power distribution reduces global clock error.

In one or more embodiments of the present invention, the integrated clock and power distribution reduces global clock power.

In one or more embodiments of the present invention, the integrated clock and power distributions use of top metal layers lowers cost and improves yield due to coarse layout rules.

In one or more embodiments of the present invention, the integrated clock and power distribution hides any diagonal geometries within the tile cell layout view.

In one or more embodiments of the present invention, the integrated clock and power distribution increases wire resources available for routing and routes spacing.

In one or more embodiments of the present invention, the integrated clock and power distribution reduces signal propagation times while reducing signal power dissipation.

In one or more embodiments of the present invention, a top metal layer voltage $V_{dd}$ FDM above a matching top-1 metal layer reference voltage $V_{ss}$ FDM creates a low impedance, approximately 1 µH/square, on-die supply that redistributes on-die power noise.

In one or more embodiments of the present invention, all breaks in the FDM for bump pads and clock routes are healed by low impedance underpass structures.

In one or more embodiments of the present invention, diagonal global clock routes are embedded in the top metal layer voltage $V_{dd}$ FDM between diamond patterned bump pads.

In one or more embodiments of the present invention, clock wires, routed diagonally, scale in maximum length by approximately 0.7x, power/length by approximately 0.4x, total power by approximately <0.2x, delay by approximately 0.6x, and cross-die non-deterministic skew by 0.4x when compared to clock wires routed in an H-tree grid with standard repeaters.

In one or more embodiments of the present invention, the integrated clock and power distribution improves on-die power supply quality. With regard to the distribution of power on-die, di/dt density is growing square with each process generation. As such, di/dt transients are redistributed to multiple bumps to control bump-pair-inductance induced voltage drop. The on-die distribution carries the burden of cross-die currents that flow between on-die transient loads and bump groups. Top plane layers are the most effective at distributing on-die currents per wiring track assigned power. Large fraction of the top metal layer is typically committed to power bump pads. In the FDM system, the pads themselves are incorporated as distribution conductors. In addition, top metal is thick so it has a low sheet resistance even if it is aluminum. The 2µ center separation of the top layer FDM pair produces a low inductance of approximately 1 μH per square. The FDM carries current on two perpendicular axes.

In one or more embodiments of the present invention, because of the integrated clock and power distribution, redistribution current is handled by the FDM pair. This allows near to the top metal layers to shrink their power busses and increase routing capacity. The size of lower metal buses shrinks to that required to support the desired vias conveniently connected to all circuits and average out the peak currents of small circuit groups.

In one or more embodiments of the present invention, a bow tie clock distribution exploits uniform poly-silicon orientation and diagonal routing to distribute a primary clock signal to a semiconductor device with minimal wire delay and minimal total wire usage.

In one or more embodiments of the present invention, a bow tie clock distribution provides for minimal clock skew and minimal clock distribution power.

In one or more embodiments of the present invention, a bow tie clock distribution utilizes diagonal routes that are approximately 30% shorter than typical Manhattan-routed H-tree distributions. Because the routes are shorter, fewer repeaters are required, thereby reducing clock distribution power.

In one or more embodiments of the present invention, a bow tie clock distribution allows for non-uniform x-axis and y-axis pitches. In one or more embodiments of the present invention, the use of bow tie elements provides for coarse pitch in the x-axis direction and fine pitch in the y-axis direction. In one or more embodiments of the present invention, the use of bow-tie elements provides for fine pitch in the x-axis direction and coarse pitch in the y-axis direction.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A semiconductor device comprising:
a semiconductor layer; and
a plurality of metal layers;
wherein a top metal layer and a top-1 metal layer are arranged as a full-dense-mesh distribution network,
the top metal layer comprises an integrated clock and power distribution network,
the top-1 metal layer comprises a low impedance underpass corresponding to the integrated clock and power distribution network,
the integrated clock and power distribution network includes a clock distribution network routed in a cut-out of a power distribution network on the top metal layer, and
the low impedance underpass on the top-1 metal layer is arranged such that the clock distribution network is coupled approximately 50% to the power distribution network on the top metal layer and is coupled approximately 50% to a ground potential on the top-1 metal layer.

2. The semiconductor device of claim 1, wherein the integrated clock and power distribution network comprises a plurality of bow tie elements.

3. The semiconductor device of claim 1, wherein the integrated clock and power distribution network comprises at least one of a portion of a bow tie element, a bow tie element, a plurality of bow tie elements, a half-bow tie element, an extended half-bow tie element, a three-half-bow tie element, a hyper-fine bow tie element, an X-tree element, an H-tree element, or additional wire.

4. The semiconductor device of claim 1, wherein the clock distribution network provides for different x-axis and y-axis pitches.

5. The semiconductor device of claim 1, wherein the clock distribution network provides fine pitch in a y-axis direction and coarse pitch in an x-axis direction.

6. A system comprising:
a semiconductor device;
a storage device;
a network device; and
an input device;
wherein the semiconductor device comprises:
a semiconductor layer, and
a plurality of metal layers,
wherein a top metal layer and a top-1 metal layer are arranged as a full-dense-mesh distribution network,
the top metal layer comprises an integrated clock and power distribution network,
the top-1 metal layer comprises a low impedance underpass corresponding to the integrated clock and power distribution network,
the integrated clock and power distribution network includes a clock distribution network routed in a cut-out of a power distribution network on the top metal layer, and
the low impedance underpass on the top-1 metal layer is arranged such that the clock distribution network is coupled approximately 50% to the power distribution network on the top metal layer and is coupled approximately 50% to a ground potential on the top-1 metal layer.

7. The system of claim 6, wherein the integrated clock and power distribution network comprises at least one of a portion of a bow tile element, a bow tie element, a plurality of bow tie elements, a half-bow tie element, an extended half-bow tie element, a three-half-bow tie element, a hyper-fine bow tie element, an X-tree element, an H-tree element, or additional wire.

8. The system of claim 6, wherein the clock distribution network provides for different x-axis and y-axis pitches.

9. The system of claim 6, wherein the clock distribution network provides fine pitch in a y-axis direction and coarse pitch in an x-axis direction.

* * * * *